US012772653B2

(12) United States Patent
Ueda et al.

(10) Patent No.: US 12,772,653 B2
(45) Date of Patent: Oct. 20, 2026

(54) LIGHT-EMITTING ELEMENT

(71) Applicant: SHARP KABUSHIKI KAISHA, Sakai City (JP)

(72) Inventors: Masaya Ueda, Sakai City (JP); Keisuke Kitano, Sakai City (JP); Masaki Yamamoto, Sakai City (JP); Makoto Izumi, Sakai City (JP); Yoshihiro Ueta, Sakai City (JP)

(73) Assignee: SHARP KABUSHIKI KAISHA, Sakai City (JP)

(*) Notice: Subject to any disclaimer, the term of this patent is extended or adjusted under 35 U.S.C. 154(b) by 589 days.

(21) Appl. No.: 18/025,823

(22) PCT Filed: Sep. 11, 2020

(86) PCT No.: PCT/JP2020/034441

§ 371 (c)(1),
(2) Date: Mar. 10, 2023

(87) PCT Pub. No.: WO2022/054223

PCT Pub. Date: Mar. 17, 2022

(65) Prior Publication Data

US 2023/0363192 A1 Nov. 9, 2023

(51) Int. Cl.
*H10K 50/115* (2023.01)
*H10K 50/15* (2023.01)
*H10K 50/16* (2023.01)

(52) U.S. Cl.
CPC ........... *H10K 50/115* (2023.02); *H10K 50/15* (2023.02); *H10K 50/16* (2023.02)

(58) Field of Classification Search
CPC ....... H10K 50/115; H10K 50/15; H10K 50/16
See application file for complete search history.

(56) References Cited

U.S. PATENT DOCUMENTS

| | | | | |
|---|---|---|---|---|
| 9,793,505 | B2* | 10/2017 | Zhou | B82Y 20/00 |
| 2010/0108984 | A1 | 5/2010 | Cho et al. | |
| 2010/0316797 | A1 | 12/2010 | Ying et al. | |
| 2017/0271549 | A1* | 9/2017 | Xu | H10H 20/857 |
| 2018/0047925 | A1* | 2/2018 | Kim | H10K 50/181 |
| 2018/0370800 | A1* | 12/2018 | Smith | H10H 20/812 |
| 2019/0115550 | A1* | 4/2019 | Kim | H10K 50/125 |
| 2019/0136130 | A1 | 5/2019 | Han et al. | |
| 2019/0264104 | A1 | 8/2019 | Onu et al. | |

(Continued)

FOREIGN PATENT DOCUMENTS

| | | | |
|---|---|---|---|
| JP | 2010114079 | A | 5/2010 |
| JP | 2019075373 | A | 5/2019 |

(Continued)

OTHER PUBLICATIONS

Ayaskanta et al., "Electronic Impurity Doping in CdSe Nanocrystals", Nano Letters, May 9, 2012, 2587-2594, vol. 12.

(Continued)

*Primary Examiner* — Steven B Gauthier
*Assistant Examiner* — E. Rhett Cheek
(74) *Attorney, Agent, or Firm* — ScienBiziP, P.C.

(57) ABSTRACT

A light-emitting element includes the following: a cathode; an anode; and a light-emitting layer disposed between the cathode and the anode, and containing a quantum dot including a core and a shell, wherein the core contains a dopant.

9 Claims, 10 Drawing Sheets

(56) References Cited

U.S. PATENT DOCUMENTS

| | | | | |
|---|---|---|---|---|
| 2020/0266372 A1* | 8/2020 | Kuo | ...................... | H10K 50/15 |
| 2021/0005780 A1* | 1/2021 | Tsai | ..................... | H10H 20/825 |
| 2021/0119068 A1* | 4/2021 | Selim | ................ | H10H 20/8232 |

FOREIGN PATENT DOCUMENTS

| | | |
|---|---|---|
| WO | 2009/099397 A1 | 8/2009 |
| WO | 2018/092638 A1 | 5/2018 |

OTHER PUBLICATIONS

Shim et al., "N-type colloidal semiconductor nanocrystals", Nature, Oct. 2000, vol. 407, Issue 6807, pp. 981-983.

* cited by examiner

LIGHT-EMITTING ELEMENT

TECHNICAL FIELD

The present disclosure relates to a light-emitting element.

BACKGROUND ART

Great attention has been drawn to quantum-dot light-emitting diodes (QLEDs) as light-emitting elements that are applicable in various fields, including display devices and illumination devices.

Unfortunately, known QLEDs cannot achieve satisfactory light emission efficiency, and studies for improving light emission efficiency have been made actively.

Patent Literature 1 for instance describes a QLED that includes a quantum-dot light-emitting layer having an organic-ligand distribution where a surface being in contact with a hole transport layer and a surface being in contact with an electron transport layer are different from each other.

CITATION LIST

Patent Literature

Patent Literature 1: Japanese Unexamined Patent Application Publication No. 2010-114079

SUMMARY

Technical Problem

However, the QLED described in Patent Literature 1 is configured such that a quantum dot with a ligand on the core's surface substituted or modified; hence, to enhance the light emission efficiency, the amount of hole injection into the core and the amount of electron injection into the core need to be controlled accurately. Unfortunately, it is realistically difficult to control the amount of carrier injection into the core accurately; thus, satisfactory light emission efficiency cannot be achieved.

To solve the above problem, one aspect of the present disclosure aims to provide a light-emitting element with improved light emission efficiency.

Solution to Problem

To solve the above problem, a light-emitting element of the present disclosure includes the following:

a cathode;

an anode; and a light-emitting layer disposed between the cathode and the anode, and containing a quantum dot including a core and a shell, wherein the core contains a dopant.

Advantageous Effect of Invention

One aspect of the present disclosure can provide a light-emitting element with improved light emission efficiency.

DESCRIPTION OF EMBODIMENTS

The following describes the embodiments of the disclosure on the basis of FIG. 1 through FIG. 14. For convenience in description, components having the same functions as components described in a particular embodiment will be denoted by the same signs, and their description will be omitted in some cases.

First Embodiment

Figure 1:
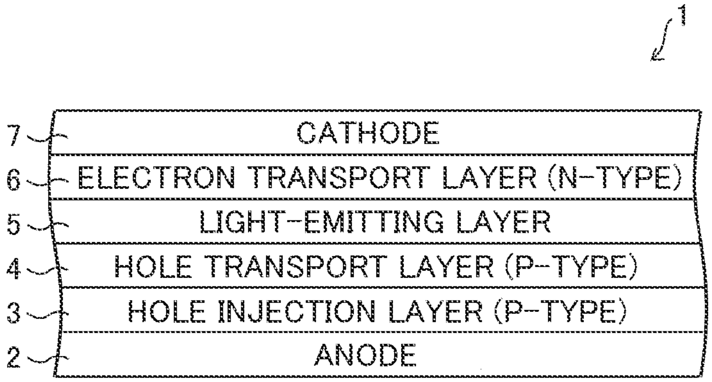
FIG. 1 is a sectional view of a schematic configuration of a light-emitting element according to a first embodiment.

FIG. 1 is a sectional view of a schematic configuration of a light-emitting element 1 according to a first embodiment.

As illustrated in FIG. 1, the light-emitting element 1 includes an anode 2, a cathode 7, and a light-emitting layer 5 between the anode 2 and the cathode 7.

Although this embodiment describes, by way of example, an instance where a hole injection layer 3 and a hole transport layer 4 are provided between the anode 2 and the light-emitting layer 5 in the recited order from near the anode 2, at least one of the hole injection layer 3 and hole transport layer 4 may be omitted as appropriate.

Further, although this embodiment describes an instance where an electron transport layer 6 is provided between the light-emitting layer 5 and the cathode 7, it is not limited to this instance. For instance, a configuration may be provided where an electron injection layer not shown is further provided, and where the electron transport layer 6 and the electron injection layer are provided between the light-emitting layer 5 and the cathode 7 in the recited order from near the light-emitting layer 5. Furthermore, a configuration may be provided where the electron transport layer 6 is replaced with an electron injection layer, or a configuration may be provided where the electron transport layer 6 and the electron injection layer are omitted as appropriate.

Figure 2:
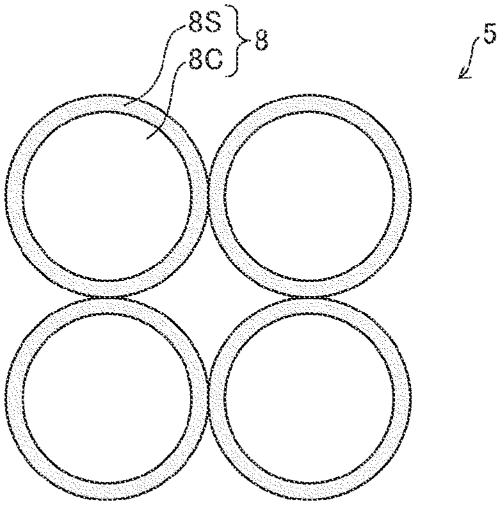
FIG. 2 illustrates a schematic configuration of a light-emitting layer included in the light-emitting element according to the first embodiment.

FIG. 2 illustrates a schematic configuration of the light-emitting layer 5 included in the light-emitting element 1 according to the first embodiment.

The light-emitting layer 5 containing a plurality of quantum dots 8 each including a core 8C and a shell 8S illustrated in FIG. 2 is a layer that emits visible light upon recombination of a hole transported from the anode 2 and an electron transported from the cathode 7.

Each quantum dot 8 contains the core 8C and the shell 8S provided on the surface of the core 8C. The quantum dot 8 preferably has a core-shell structure having the core 8C and the shell 8S covering at least part of the surface of the core 8C. It is noted that the shell 8S particularly desirably covers the entire core 8C.

Further, the configuration in this embodiment is satisfied when the fact that the shell 8S is provided over the core 8C is recognized through an observation of one sectional view of the quantum dot 8. It is noted that a core-shell structure can be regarded to be provided when the fact that the shell 8S covers the core 8C is recognized through an observation of one sectional view of the quantum dot 8.

Commonly, a single pixel of a display device includes a red subpixel, a green subpixel and a blue subpixel; moreover, the red subpixel includes a light-emitting element that includes a light-emitting layer that emits red light, the green subpixel includes a light-emitting element that includes a light-emitting layer that emits green light, and the blue subpixel includes a light-emitting element that includes a light-emitting layer that emits blue light.

Cores of the same material that have different particle diameters can be used in order for the light-emitting layer 5 containing the quantum dots 8 to emit different colors. For instance, a core having the largest particle diameter can be used for a light-emitting layer that emits red, a core having the smallest particle diameter can be used for a light-emitting layer that emits blue, and a core having a particle diameter that falls between the particle diameter of the core used for the light-emitting layer that emits red and the particle diameter of the core used for the light-emitting layer that emits blue can be used for a light-emitting layer that emits green.

Further, cores of different materials may be used in order for the light-emitting layer 5 containing the quantum dots 8 to emit different colors.

The core 8C of the light-emitting layer 5 illustrated in FIG. 2 contains an acceptor impurity (first acceptor impurity) as a dopant. That is, the core 8C is a p-type core doped with an acceptor impurity.

Here, that the core 8C contains a dopant refers to that an acceptor impurity is detected. TEM-EDX can be used for instance in measurement.

Although this embodiment describes, by way of example, an instance where a core of CdSe doped with Ag, which is herein an acceptor impurity, is used as the core 8C, any kind of dopant-containing core may be used, such as a p-type core, or an n-type core that will be described later on in a fourth embodiment.

Liquid-phase synthesis for instance can be used to dope CdSe, a core material, with Ag. Such a standard cation-exchange procedure as described in Non-Patent Literature [Nano Lett. 2012,12,2587-2594] can be used for instance. CdSe is substituted by $Ag_2Se$ by, for instance, exposing CdSe, a core material, to Ag ions within an ethanol-and-$AgNO_3$ mixed solution. The core 8C of CdSe doped with Ag, which is an acceptor impurity, can be obtained in the foregoing manner.

Further, the core 8C may be entirely doped with an acceptor impurity or may be doped with an acceptor impurity in only a portion distant from the center of the core 8C by a half or more of the radius of the core 8C by, for instance, regulating, as appropriate, the amount of $AgNO_3$, regulating the time during which CdSe undergoes Ag-ion exposure or regulating other things in the foregoing liquid-phase synthesis. Further, the doping density of the acceptor impurity in the core 8C may be uniform throughout the core 8C or may be different from region to region within the core 8C.

Although this embodiment has described, by way of example, an instance where Ag is used as an acceptor impurity, Mg for instance may be used as an acceptor impurity.

It is noted that the acceptor impurity concentration of the core 8C is preferably $1\times10^{19}$ acceptors/$cm^3$ or greater and is further preferably $5\times10^{19}$ acceptors/$cm^3$ or greater.

The shell 8S may be made of an indirect-band-gap semiconductor material. It is noted that the shell 8S, when made of an indirect-band-gap semiconductor material, preferably has a thickness of 0.2 to 4 nm inclusive. When the shell 8S is made of an indirect-band-gap semiconductor material as described, carriers tunnel toward the core 8C, thus achieving an effect, that is, a contribution to light emission. The indirect-band-gap semiconductor material may be any material that allows carriers to tunnel toward the core 8C, such as silicon carbide or diamond.

The light-emitting layer 5 illustrated in FIG. 2 may further contain an organic compound, such as an organic ligand not shown. For instance, dodecanethiol, ethanolamine, or other things may be contained as the organic ligand. The light-emitting layer 5 may contain an organic solvent ingredient other than the organic ligand. The organic solvent ingredient may contain a hexane or an octane for instance. The light-emitting layer 5 may contain an inorganic ligand, such as S, other than the organic ligand.

It is noted that the core 8C and the shell 8S, surrounding the core 8C, may contain one or more semiconductor materials selected from the group consisting of, for instance, Cd, S, Te, Se, Zn, In, N, P, As, Sb, Al, Ga, Pb, Si, Ge and Mg, and their compounds as a material that constitutes the quantum dots 8 of the light-emitting layer 5. Further, the quantum dots 8 may fall under, for instance, a binary-core type, a tertiary-core type, a quaternary-core type, a core-shell type or a core-multi-shell type.

Further, the light-emitting layer 5 may contain doped nanoparticles or may have an inclined-composition structure. Further, the composition of a constituent element may be adjusted through processing into mixed crystals in order to obtain a necessary light emission wavelength.

The light-emitting layer 5 may have any thickness that can provide a location for electron-and-hole recombination to exert the function of light emission; for instance, the light-emitting layer 5 can have a thickness of about 1 to 200 nm.

Any method through which a fine pattern that is required for a light-emitting element can be formed may be used to form the light-emitting layer 5. Examples of such an applicable method include evaporation, printing, inkjet printing, spin coating, casting, dipping, bar coating, blade coating, roll coating, gravure coating, flexographic printing, spray coating, photolithography, and self-assembling (layer-by-layer adsorption, self-assembled monolayer method). It is particularly preferable to use evaporation, spin coating, inkjet printing, or photolithography. Examples of the evaporation include vacuum evaporation, sputtering and ion plating, and examples of the vacuum evaporation include resistance-heating evaporation, flash evaporation, arc evaporation, laser evaporation, radiofrequency heating evaporation and electron beam evaporation. For forming a light-emitting layer through application of an applied liquid, such as spin coating or inkjet printing, the applied liquid may contain any solvent that can dissolve or disperse the individual materials of the light-emitting layer; applicable examples include toluene, xylene, cyclohexanone, cyclohexanol, tetralin, mesitylene, methylene chloride, tetrahydrofuran, dichloroethane, and chloroform.

The hole injection layer 3 illustrated in FIG. 1 may contain any hole injection material that can stabilize hole injection into the light-emitting layer 5. Examples of such a hole injection material include an arylamine derivative, a porphyrin derivative, a phthalocyanine derivative, a carbazole derivative, and conductive polymers, such as a polyaniline derivative, a polythiophene derivative and a polyphenylenevinylene derivative. Furthermore, the hole injection layer 3 more desirably contains poly(3,4-ethylenedioxythiophene)-polystyrene sulphonate (PEDOT-PSS). PEDOT-PSS, which facilities carrier injection into a hole transport layer, often improves the efficiency of light emission that results from electron-and-hole recombination within the light-emitting layer 5 and thus improves the light emission properties of the light-emitting element 1. As such, the hole injection layer 3, although formed of PEDOT-PSS in this embodiment, may be formed of a material other than PEDOT-PSS.

The hole transport layer 4 illustrated in FIG. 1 may contain any hole transport material that can stabilize hole transport to the light-emitting layer 5. It is particularly preferable that such a hole transport material be one having high hole mobility. It is furthermore preferable that the hole transport material be one (electron blockage material) that can prevent penetration of electrons moved from the cathode 7. This is because that such a material can enhance the efficiency of hole-and-electron recombination within the light-emitting layer 5.

Examples of a material that is used for the hole transport layer 4 include an arylamine derivative, an anthracene derivative, a carbazole derivative, a thiophene derivative, a fluorene derivative, a distyrylbenzene derivative, and a spiro compound. Furthermore, it is more desirable that a material that is used for the hole transport layer 4 be polyvinyl carbazole (PVK) or poly[(9,9-dioctylfluorenyl-2,7-diyl)-co-(4,4'-(N-(4-sec-butylphenyl))diphenylamine (TFB). PVK and TFB, which improve the efficiency of light emission that results from electron-and-hole recombination within the light-emitting layer 5, has an effect, that is, improving the light emission properties of the light-emitting element 1. As such, the hole injection layer 4, although formed of TFB in this embodiment, may be formed of a material other than TFB.

Further, the hole transport layer 4 may be formed of an inorganic semiconductor material. Examples of the inorganic semiconductor material include a metal oxide (including an oxide semiconductor), a nitride semiconductor, and an arsenide semiconductor. The inorganic semiconductor material, when used for forming the hole transport layer 4, may be doped with an acceptor impurity so as to prominently have a hole transport capability. A specific example of the acceptor impurity, a dopant, is Mg in the case of a nitride semiconductor.

The acceptor impurity concentration of the hole transport layer 4 is preferably $1\times10^{18}$ acceptors/$cm^3$ and more and is further preferably $1\times10^{19}$ acceptors/$cm^3$ or more.

The hole injection layer 3 may have any thickness with which its hole injection function is exerted sufficiently, and the hole transport layer 4 may have any thickness with which its hole transport function is exerted sufficiently. Non-limiting examples of a method of forming the hole injection layer 3 and a method of forming the hole transport layer 4 include evaporation, printing, inkjet printing, spin coating, casting, dipping, bar coating, blade coating, roll coating, gravure coating, flexographic printing, spray coating, photolithography, and self-assembling (layer-by-layer adsorption, self-assembled monolayer method). It is particularly preferable to use evaporation, spin coating, inkjet printing, or photolithography.

The electron transport layer 6 illustrated in FIG. 1 may contain any material that can transport electrons injected from the cathode 7 to the light-emitting layer 5. It is particularly preferable that such an electron transport material be one having high electron mobility. It is furthermore preferable that the electron transport material be one (hole blockage material) that can prevent penetration of holes moved from the anode 2. This is because that such a material can enhance the efficiency of hole-and-electron recombination within the light-emitting layer 5.

Examples of the electron transport material include oxadiazoles, triazoles, phenanthrolines, a silole derivative, a cyclopentadiene derivative, an aluminum complex, a metal oxide (including an oxide semiconductor), a nitride semiconductor, and an arsenide semiconductor. A specific example of the oxadiazole derivatives is (2-(4-biphenylyl)-5-(4-tert-butylphenyl)-1,3,4-) oxadiazole (PBD), specific examples of the phenanthrolines include bathocuproine (BCP) and bathophenanthroline (BPhen), and specific examples of the aluminum complex include a tris(8-quinolinol) aluminum complex (Alq3) and a bis (2-methyl-8-quinolato)(p-phenylphenolate) aluminum complex (BAlq).

Examples of the electron transport material, which is herein a metal oxide, include ZnO, MgZnO, $TiO_2$, $Ta_2O_3$, $SrTiO_3$, and $Mg_xZn_{1-x}O$ (where x denotes the ratio of Zn substituted by Mg within ZnO).

Furthermore, examples of the electron transport material, which is herein an inorganic semiconductor material, include a group II-VI semiconductor material and a group III-V semiconductor material. Examples of the group II-VI semiconductor material include ZnS, ZnSe, ZnTe, CdS, CdSe, CdTe, HgTe and their mixed crystals, and examples of the group III-V semiconductor material include AlP, AlAs, AlN, AlSb, GaN, GaP, GaAs, GaSb, InP, InAs, InSb, InN and their mixed crystals.

Although being unnecessary if the foregoing semiconductor materials are natively n-type materials, donor impurity doping may be performed, as necessary, on these semiconductor materials.

The electron transport layer 6 is preferably made of $Mg_xZn_{1-x}O$. $Mg_xZn_{1-x}O$, which can regulate ionization potential and electron affinity by regulating x, has an effect, that is, an electron transport layer suitable for the light emission wavelength of a QD light-emitting layer can be prepared easily. The electron transport layer 6, although formed of $Mg_xZn_{1-x}O$ in this embodiment, may be formed of a material other than $Mg_xZn_{1-x}O$.

It is noted that an electron injection layer not shown may be formed between the cathode and the electron transport layer 6. The electron injection layer may contain any electron injection material that can stabilize electron injection into the light-emitting layer 5. Examples of the electron injection material include alkaline metals or alkaline earth metals, such as aluminum, strontium, calcium, lithium, cesium, magnesium oxide, aluminum oxide, strontium oxide, lithium oxide, lithium fluoride, magnesium fluoride, strontium fluoride, calcium fluoride, barium fluoride, cesium fluoride, sodium polymethylmethacrylate polystyrene sulphonate, and include an oxide of alkaline metal or alkaline earth metal, a fluoride of alkaline metal or alkaline earth metal, and an organic complex of alkaline metal.

The electron transport layer 6 may have any thickness with which its electron transport function is exerted sufficiently, and the electron injection layer may have any thickness with which its electron injection function is exerted sufficiently. Further, non-limiting examples of a method of forming the electron transport layer 6 and a method of forming the electron injection layer not shown include evaporation, printing, inkjet printing, spin coating, casting, dipping, bar coating, blade coating, roll coating, gravure coating, flexographic printing, spray coating, photolithography, and self-assembling (layer-by-layer adsorption, self-assembled monolayer method). It is particularly preferable to use evaporation, spin coating, inkjet printing, or photolithography. Further, the electron transport layer 6 may be formed with different materials, different thicknesses and others, depending on the color of light emitted by the light-emitting layer 5, or the electron transport layer 6 may be formed with the same material and the same thickness irrespective of the color of light emitted by the light-emitting layer 5.

The anode 2 illustrated in FIG. 1 preferably contains a conductive material having a large work function so that holes are injected easily. Examples include the following: metals, including Au, Ta, W, Pt, Ni, Pd, Cr, Cu, Mo, alkaline metals and alkaline earth metals; oxides of these metals; alloys, including Al alloys, such as AlLi, AlCa and AlMg, Mg alloys, such as MgAg, Ni alloys, Cr alloys, alkaline metal alloys and alkaline earth metal alloys; inorganic oxides, including indium tin oxide (ITO), indium zinc oxide (IZO), zinc oxide (ZnO) and indium oxide; conductive polymers, including metal-doped polythiophene, polyaniline, polyacethylene, a polyalkylthiophene derivative and a polysilane derivative; and $\alpha$-Si and $\alpha$-SiC. These conductive materials may be used alone or in combination of two or more kinds. When two or more kinds are used, layers made of the respective materials may be stacked. It is noted that indium tin oxide (ITO) is used more desirably. Indium tin oxide (ITO), which has been used in many displays as a transparent electrode and can be diverted into a manufacture device, has an effect, that is, saving manufacturing costs.

The anode 7 illustrated in FIG. 1 preferably contains a conductive material having a small work function so that electrons are injected easily. A metal material is particularly more desirably. In this case, an effect, that is, high conductivity is achieved. Examples include magnesium alloys, such as MgAg, aluminum alloys, such as AlLi, AlCa and AlMg, and alloys of alkaline metal and alkaline earth metal, such as Li, Cs, Ba, Sr, and Ca. It is noted that Al or Al alloy is more desirably used. Al or Al alloy, which is highly applicable as an electrode and relatively inexpensive, can achieve an effect, that is, saving manufacturing costs.

The anode 2 and the cathode 7 can be formed through a typical method of electrode formation; examples include physical vapor deposition (PVD), such as vacuum evaporation, sputtering, EB evaporation or ion plating, and chemical vapor deposition (CVD). Further, the anode 2 and the cathode 7 may be patterned through any method that can form them into a desired pattern accurately; specific examples include photolithography and inkjet printing.

One of the anode 2 and cathode 7 that serves as a light taking surface needs to be a transparent electrode. In contrast, the other electrode opposite to the light taking surface may or may not be transparent. Further, the anode 2 and the cathode 7 preferably have a small resistance and are thus typically made of a metal material, which is a conductive material, but they may be made of an organic compound or an inorganic compound.

Figure 3:
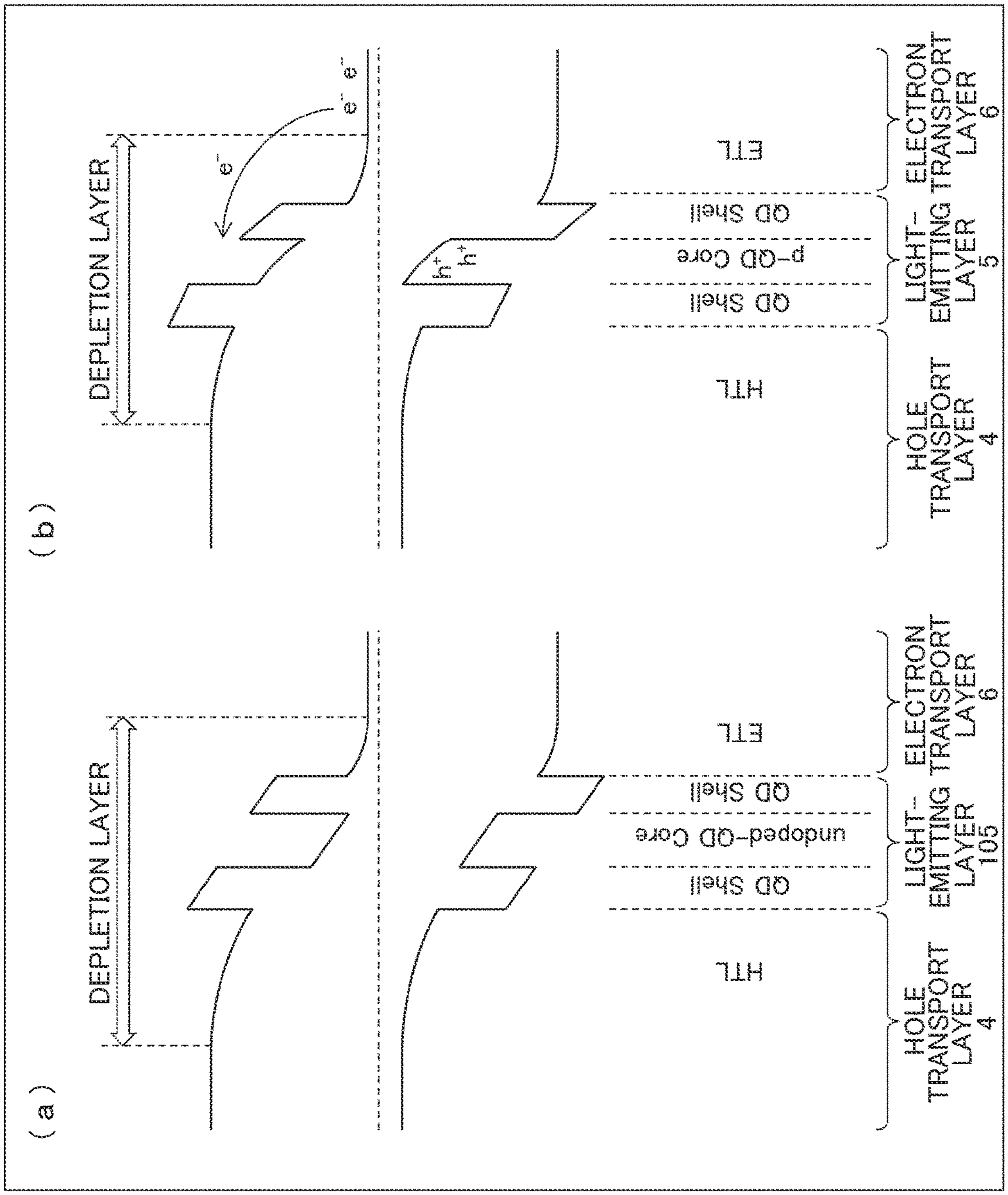
FIG. 3(*a*) illustrates the band of a known light-emitting element that includes a light-emitting layer composed of a quantum dot including a core doped with no dopant, and FIG. 3(*b*) illustrates the band of the light-emitting element according to the first embodiment.

FIG. 3(*a*) illustrates the band of a known light-emitting element that includes a light-emitting layer 105 composed of a quantum dot including a core doped with no dopant.

To enhance the light emission efficiency in the known light-emitting element having the configuration illustrated in FIG. 3(*a*), the amount of hole injection into the core and the amount of electron injection into the core need to be controlled accurately. Unfortunately, it is realistically difficult to control the amount of carrier (holes and electrons) injection into the core accurately; thus, satisfactory light emission efficiency cannot be achieved.

FIG. 3(*b*) illustrates the band of the light-emitting element 1 that includes the light-emitting layer 5 containing the core 8C of p-type doped with an acceptor impurity.

As illustrated in FIG. 3(*b*), the core 8C, which contains an acceptor impurity as a dopant, has holes $h^+$ awaiting, which are herein major carriers, and injecting electrons $e^-$, which are herein minor carriers, thereinto allows the light-emitting element 1 to emit light.

As such, the light-emitting element 1, which can control carrier balance (balance between holes and electrons) by only the amount of electron injection, can improve light emission efficiency further than the known light-emitting element having the configuration illustrated in FIG. 3(*a*).

Second Embodiment

Figure 4:
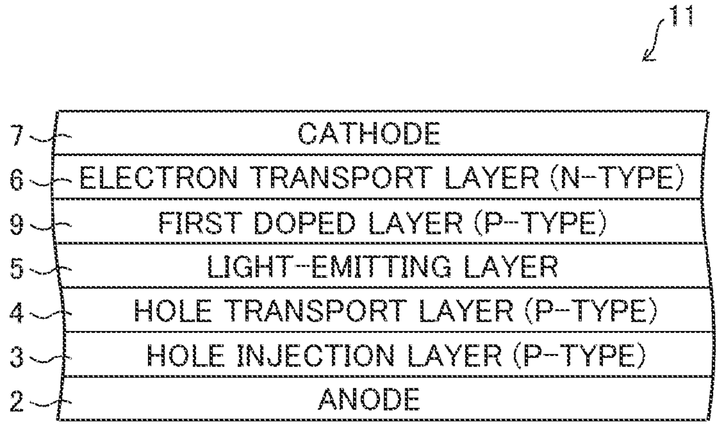
FIG. 4 is a sectional view of a schematic configuration of a light-emitting element according to a second embodiment.
Figure 5:
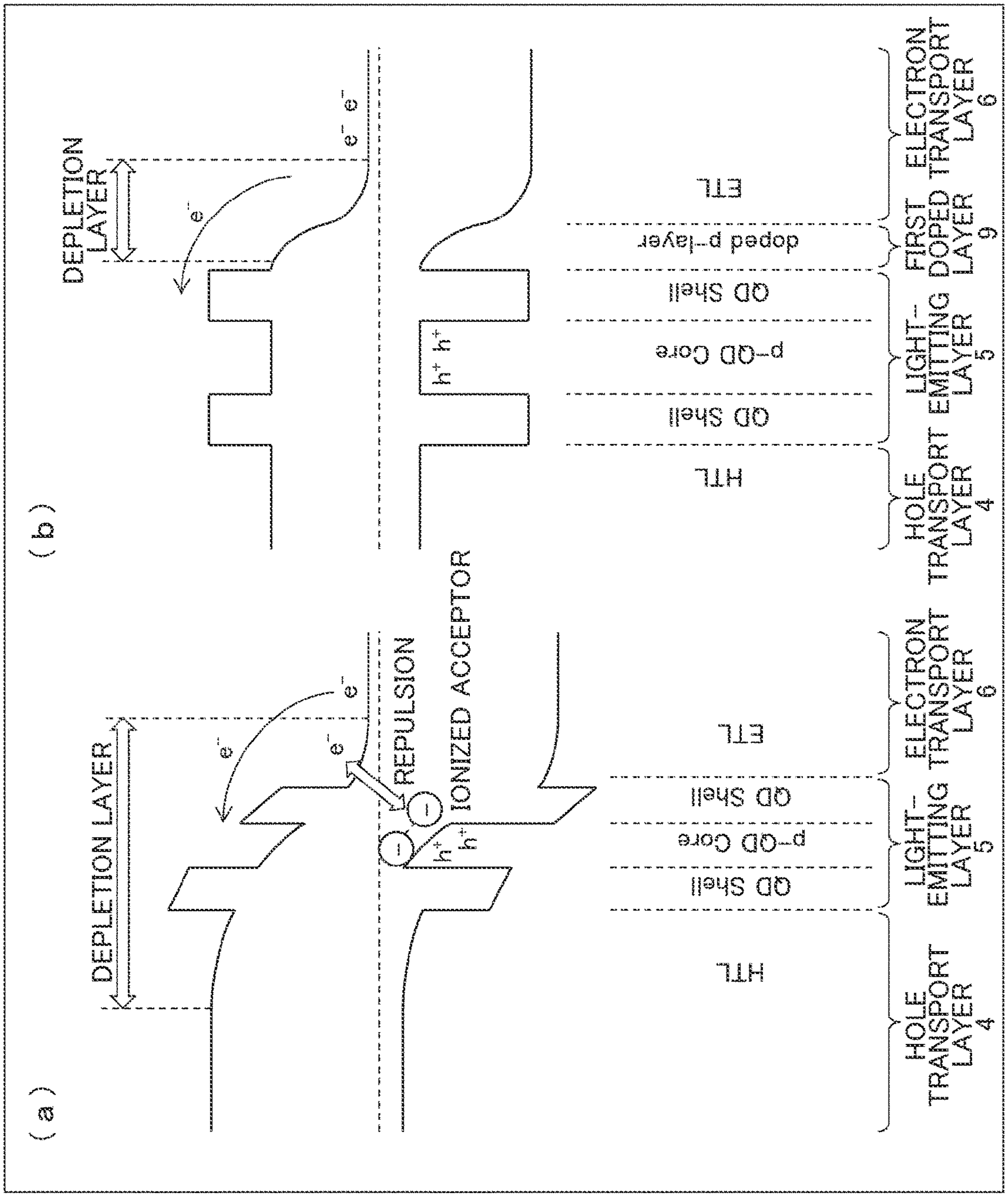
FIG. 5(*a*) illustrates the band of the light-emitting element according to the first embodiment, and FIG. 5(*b*) illustrates the band of the light-emitting element according to the second embodiment.
Figure 6:
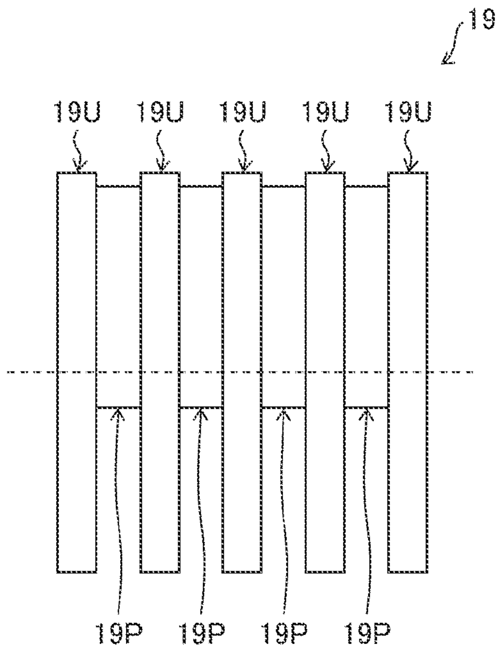
FIG. 6 illustrates a modification of a first doped layer included in the light-emitting element according to the second embodiment.

The following describes a second embodiment of the disclosure on the basis of FIG. 4 through FIG. 6. A light-emitting element 11 according to this embodiment is different from the light-emitting element 1 described in the first embodiment in that a first doped layer 9 containing an acceptor impurity is further provided between the electron transport layer 6 and the light-emitting layer 5. The others are as described in the first embodiment. For convenience in description, components having the same functions as the components shown in the drawings relating to the first embodiment will be denoted by the same signs, and their description will be omitted.

FIG. 4 is a sectional view of a schematic configuration of the light-emitting element 11 according to the second embodiment.

The light-emitting element 11 illustrated in FIG. 4 further includes, between the electron transport layer 6 and the light-emitting layer 5, the first doped layer 9 containing an acceptor impurity.

The acceptor impurity (second acceptor impurity) contained in the first doped layer 9 may be an acceptor impurity identical to or different from the acceptor impurity (first acceptor impurity) contained in the core 8C.

The first doped layer (highly doped p-type layer) 9 may be an organic layer made of an organic material containing an acceptor impurity, or an inorganic layer made of an inorganic material containing an acceptor impurity.

The first doped layer 9 can be formed of, for instance, an inorganic semiconductor material containing an acceptor impurity; examples of the inorganic semiconductor material include a group II-VI semiconductor material and a group III-V semiconductor material. Examples of the group II-VI semiconductor material include ZnS, ZnSe, ZnTe, CdS, CdSe, CdTe, HgTe and their mixed crystals, and examples of the group III-V semiconductor material include AlP, AlAs, AlN, AlSb, GaN, GaP, GaAs, GaSb, InP, InAs, InSb, InN and their mixed crystals.

The foregoing semiconductor materials may be doped with an acceptor impurity through, but not limited to, the foregoing liquid-phase synthesis or supercritical synthesis. This embodiment has described, by way of example, that a semiconductor material doped with an acceptor impurity is obtained by adding (determining an addition amount by reflecting the density of holes within the first doped layer 9) a predetermined amount of Mg material, which is herein an acceptor impurity, to GaN ($GaCl_3$, $Li_3N$) through supercritical synthesis. Although this embodiment has dealt with Mg as an example acceptor impurity doped in a semiconductor material, an acceptor impurity may be Ag or other materials for instance.

The first doped layer 9 can be formed by using such a semiconductor material doped with an acceptor impurity and thorough a method similar to the forgoing method of forming the electron transport layer 6.

The acceptor impurity concentration of the first doped layer 9 is preferably $1\times10^{19}$ acceptors/$cm^3$ and more and is further preferably $5\times10^{19}$ acceptors/$cm^3$ or more.

Furthermore, the acceptor impurity concentration of the first doped layer 9 is preferably higher than the acceptor impurity concentration of the hole transport layer 4; in the light-emitting element 11 according to this embodiment, the acceptor impurity concentration of the hole transport layer 4 stands at $1\times10^{19}$ acceptors/$cm^3$, and the acceptor impurity concentration of the first doped layer 9 stands at $5\times10^{19}$ acceptors/$cm^3$. It is noted that the acceptor impurity concentrations can be measured through SIMS for instance.

The thickness of the first doped layer 9 is preferably equal to or larger than the thickness of a stack of several molecules and equal to or smaller than 50 nm, and the thickness is further preferably equal to or larger than the thickness of a stack of several molecules and equal to or smaller than 20 nm.

FIG. 5(*a*) illustrates the band of the light-emitting element 1 according to the first embodiment, and FIG. 5(*b*) illustrates the band of the light-emitting element 11 according to the second embodiment.

In the light-emitting element 1 according to the first embodiment, which does not include the foregoing first doped layer 9, the core 8C of the quantum dot 8 within the light-emitting layer 5 is depleted to cause ionized acceptors (negatively electrified to repel electrons) to remain, as illustrated in FIG. 5(*a*). Accordingly, due to the effect of the repulsion of the ionized acceptors remaining in the core 8C, a relatively high voltage needs to be applied in order to inject electrons $e^-$ into the core 8C.

In the light-emitting element 11 according to this embodiment by contrast, which includes the foregoing first doped layer 9 between the electron transport layer 6 and the light-emitting layer 5, the core 8C of the quantum dot 8 within the light-emitting layer 5 can be prevented from depletion, as illustrated in FIG. 5(*b*). Accordingly, applying a relatively low voltage to inject electrons $e^-$, which are herein minor carriers, into the core 8C with holes $h^+$ awaiting, which are herein major carriers, enables light emission.

FIG. 6 illustrates a modification of the first doped layer 9 included in the light-emitting element 11 according to the second embodiment.

A first doped layer 19 illustrated in FIG. 6 includes a plurality of p-type doped layers 19P, and between the plurality of p-type doped layers 19P is a separation layer 19U containing no dopant and having a band gap larger than the band gaps of the p-type doped layers 19P. It is noted here that each p-type doped layer 19P is the foregoing first doped layer 9.

In the first doped layer 9 included in the light-emitting element 11, p-type activation energy increases along with increase in band gap. In the first doped layer 19 having a super-lattice shape by contrast, as illustrated in FIG. 6, the p-type activation energy can be maintained as it is even when the band gap is increased substantially.

The first doped layer 19 having such a super-lattice shape can be used suitably when one wants to adjust its band gap to avoid the first doped layer from absorbing light from the light-emitting layer 5.

It is noted that at least one of the p-type doped layer 19P and separation layer 19U illustrated in FIG. 6 may contain nanoparticles. Providing nanoparticles as described can further facilitate band gap adjustment.

Specific examples of a combination of the p-type doped layer 19P and separation layer 19U include a combination of ZnO and ZnMgO, a combination of GaN and AlGaN, a combination of InGaN and GaN, and a combination of $Zn_xMg_{1-x}O$ and $Al_xIn_yGa_{1-x-y}N$ ($0\leq x\leq 1$ and $0\leq y\leq 1$, in which the band gap of the separation layer 19U>the band gap of the p-type doped layer 19P is satisfied).

Third Embodiment

Figure 7:
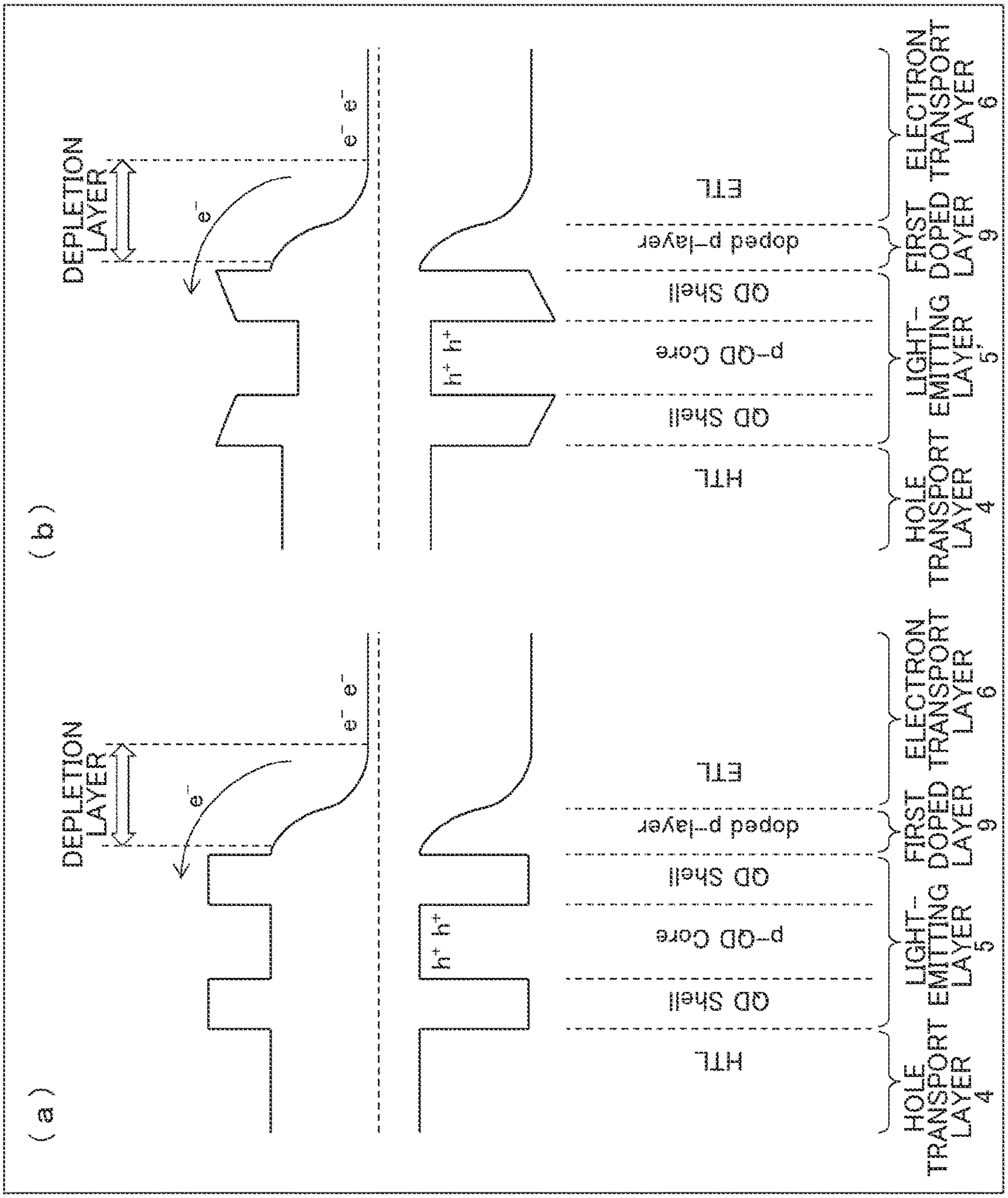
FIG. 7(*a*) illustrates the band of the light-emitting element according to the second embodiment, and FIG. 7(*b*) illustrates the band of a light-emitting element according to a third embodiment.

The following describes a third embodiment of the disclosure on the basis of FIG. 7. A light-emitting element according to this embodiment is different from the light-emitting element 11 described in the second embodiment in that the quantum dot 8 of a light-emitting layer 5' included in the light-emitting element is configured such that not only the core 8C contains an acceptor impurity, but also the shell 8S contains an acceptor impurity. The others are as described in the second embodiment. For convenience in description, components having the same functions as the components shown in the drawings relating to the second embodiment will be denoted by the same signs, and their description will be omitted.

FIG. 7(*a*) illustrates the band of the light-emitting element 11 according to the second embodiment, and FIG. 7(*b*) illustrates the band of the light-emitting element according to the third embodiment.

The quantum dot 8 of the light-emitting layer 5' included in the light-emitting element according to this embodiment is configured such that not only the core 8C contains an acceptor impurity, but also the shell 8S contains an acceptor impurity (third acceptor impurity). In a case like this, where not only the core 8C, but also the shell 8S contains an acceptor impurity, a barrier against hole injection from the anode 2 can be lowered.

It is noted that the concentration of the acceptor impurity contained in the shell 8S may be uniform throughout the shell 8S or may be different from region to region within the shell 8S. Furthermore, the concentration of the acceptor impurity contained in the shell 8S may be increased or decreased gradually in accordance with the distance from the core 8C.

The concentration of the acceptor impurity contained in the shell 8S is set in this embodiment so as to increase along with distance from the core 8C. The shell 8S thus contains an acceptor impurity that increases in number along with distance from the core 8C (outward from the core 8C), but as illustrated in the band of QD Shells in FIG. 7(*b*), the shell 8S has a band gap that does not vary throughout the shell 8S and has a valence band and a conduction band that become high along with distance from the core 8C. In such a configuration, the valence band of the shell 8S becomes high along with approach to the outside of the shell 8S, thereby enabling a barrier against hole injection from the anode 2 to be lowered, thus enabling the efficiency of the hole injection to be improved. In the light-emitting element according to this embodiment in particular, the valence band of the shell 8S, which is inclined in such a manner that the barrier enlarges gradually from a direction where holes are supplied, offers an effect, that is, substantial barrier downsizing.

The shell 8S can be doped with an acceptor impurity through a method similar to the foregoing method of doping the core 8C with an acceptor impurity described in the first embodiment.

It is noted that when the core 8C and the shell 8S are to be doped with the same kind of acceptor impurity, the quantum dot 8 including the core 8C and shell 8S may be doped with an acceptor impurity. That is, the core 8C and the shell 8S may be doped with an acceptor impurity at one time in a single process step.

When the core 8C and the shell 8S are to be doped with different kinds of acceptor impurity in contrast, a process step of doping the core 8C with an acceptor impurity and a process step of doping the shell 8S with an acceptor impurity need to be performed separately.

In this embodiment, the quantum dot 8 including the core 8C already doped with an acceptor impurity, and the shell 8S formed so as to cover the core 8C and doped with no acceptor impurity is doped with an acceptor impurity so that the shell 8S has more acceptor impurities along with distance from the core 8C. Doping the shell 8S with an acceptor impurity from outside in this way enables the shell 8S near the core 8C to have a low acceptor impurity concentration and enables the shell 8S far from the core 8C to have a high acceptor impurity concentration, but this is non-limiting. For instance, one may perform doping while changing the concentration of the acceptor impurity in order to grow a crystal of the shell 8C.

Furthermore, the shell 8S may be formed of, for instance, a plurality of layers having different acceptor impurity concentrations, and the acceptor impurity concentrations of the plurality of respective layers may be set high in ascending order of distance from the core 8C. For instance, when the shell 8S is formed of two layers having different acceptor impurity concentrations, the acceptor impurity concentration of a first layer disposed near the core 8C and having a lower acceptor impurity concentration may be set at $5\times10^{17}$ acceptors/$cm^3$, and the acceptor impurity concentration of a second layer disposed farther away from the core 8C and having a higher acceptor impurity concentration may be set at $1\times10^{18}$ acceptors/$cm^3$.

As described above, this embodiment has described a non-limiting instance where the shell 8S is doped with an acceptor impurity; for instance, the crystal of the shell 8S may be grown in such a manner that the concentration of at least one element that constitutes a compound contained in the shell 8S has a gradient between a first region of the shell 8S being closest to the core 8C and a second region of the shell 8S being farthest from the core 8C. An example of such a case is growing the crystal of the shell 8S by using, for instance, MgS, ZnS and a mixed crystal of them.

Furthermore, the shell 8S may be formed of a plurality of layers in such a manner that the concentration of at least one element that constitutes the compound contained in the shell 8S has a gradient between the first region of the shell 8S, which is closest to the core 8C, and the second region of the shell 8S, which is farthest from the core 8C.

The foregoing configuration where the concentration of at least one element that constitutes the compound contained in the shell 8S has a gradient between the first region of the shell 8S, which is closest to the core 8C, and the second region of the shell 8S, which is farthest from the core 8C, can achieve an effect similar to that achieved in an instance where the concentration of the acceptor impurity contained in the shell 8S is set so as to increase or decrease gradually in accordance with the foregoing distance from the core 8C.

Fourth Embodiment

Figure 8:
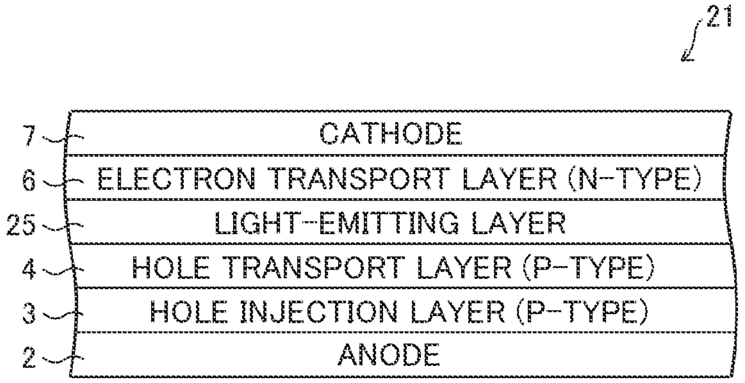
FIG. 8 is a sectional view of a schematic configuration of a light-emitting element according to a fourth embodiment.
Figure 9:
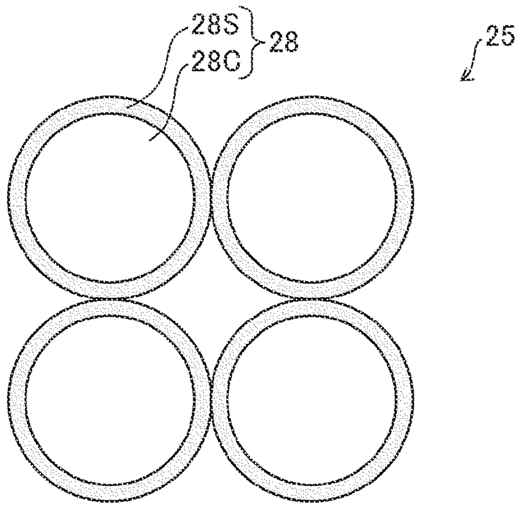
FIG. 9 illustrates a schematic configuration of a light-emitting layer included in the light-emitting element according to the fourth embodiment.
Figure 10:
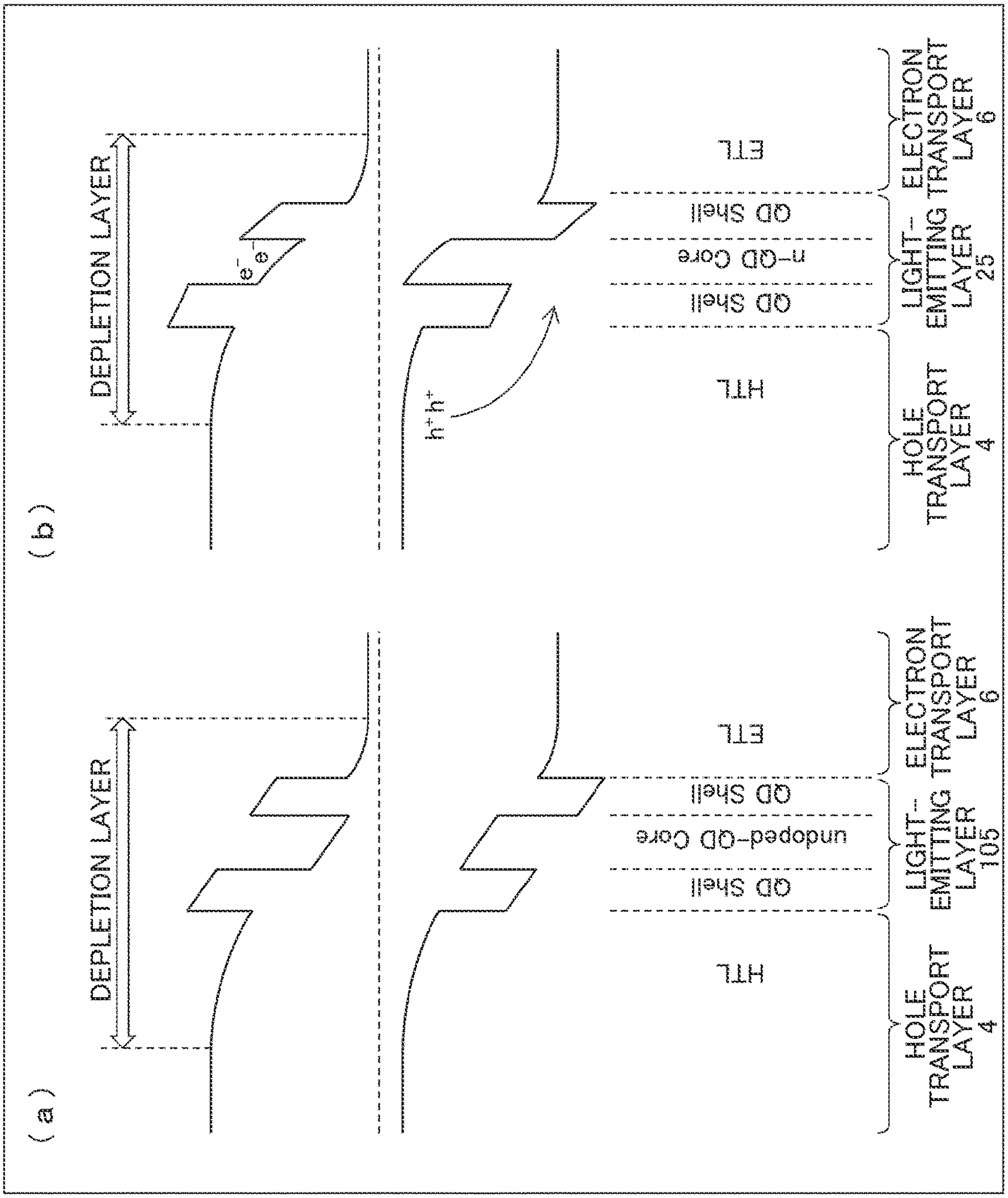
FIG. 10(*a*) illustrates the band of a known light-emitting element that includes a light-emitting layer composed of a quantum dot including a core doped with no dopant, and FIG. 10(*b*) illustrates the band of the light-emitting element according to the fourth embodiment.

The following describes a fourth embodiment of the disclosure on the basis of FIG. 8 through FIG. 10. A light-emitting element 21 according to this embodiment is different from the light-emitting element 1 described in the first embodiment in that a light-emitting layer 25 including a core 28C containing a donor impurity is provided. The others are as described in the first embodiment. For convenience in description, components having the same functions as the components shown in the drawings relating to the first embodiment will be denoted by the same signs, and their description will be omitted.

FIG. 8 is a sectional view of a schematic configuration of the light-emitting element 21 according to the fourth embodiment.

As illustrated in FIG. 8, the light-emitting element 21 includes the anode 2, the cathode 7, and the light-emitting layer 25 between the anode 2 and the cathode 7.

Although this embodiment describes, by way of example, an instance where the hole injection layer 3 and the hole transport layer 4 are provided between the anode 2 and the light-emitting layer 25 in the recited order from near the anode 2, at least one of the hole injection layer 3 and hole transport layer 4 may be omitted as appropriate.

Further, although this embodiment describes an instance where the electron transport layer 6 is provided between the light-emitting layer 25 and the cathode 7, it is not limited to this instance. For instance, a configuration may be provided where an electron injection layer not shown is further provided, and where the electron transport layer 6 and the electron injection layer are provided between the light-emitting layer 25 and the cathode 7 in the recited order from near the light-emitting layer 25. Furthermore, a configuration may be provided where the electron transport layer 6 is replaced with an electron injection layer, or a configuration may be provided where the electron transport layer 6 and the electron injection layer are omitted as appropriate.

FIG. 9 illustrates a schematic configuration of the light-emitting layer 25 included in the light-emitting element 21 according to the fourth embodiment.

The light-emitting layer 25 containing a plurality of quantum dots 28 including a core 28C and a shell 28S illustrated in FIG. 9 is a layer that emits visible light upon recombination of a hole transported from the anode 2 and an electron transported from the cathode 7.

The core 28C of the light-emitting layer 25 illustrated in FIG. 9 contains a donor impurity (first donor impurity) as a dopant. That is, the core 28C is an n-type core doped with a donor impurity.

Here, that the core 28C contains a dopant refers to that a donor impurity is detected. TEM-EDX can be used for instance in measurement.

Although this embodiment describes, by way of example, an instance where the core 28C, which is herein CdSe, CdS, ZnO or other things for instance, contains biphenyl radical anion or Na, which are donor impurities, any kind of n-type core may be provided.

Such an electron transfer method as described in, for instance, Non-Patent Literature [SHIM, Moonsub; GUYOT-SIONNEST, Philippe.N-type colloidal semiconductor nanocrystals. Nature, 2000, 407.6807:981-983] can be used to obtain an n-type core. For instance, exposing CdSe, CdS, ZnO or other things, which are core materials, to biphenyl radical anion or Na, which are donor impurities, can offer an n-type core.

Further, the core 28C may be doped with a donor impurity entirely or may be doped with a donor impurity in only a portion distant from the center of the core 28C by a half or more of the radius of the core 28C by, for instance, regulating the amount of biphenyl radical anion or Na as appropriate, regulating, as appropriate, the time during which CdSe, CdS, ZnO or other things undergoes donor impurity exposure or regulating other things as appropriate, in the foregoing electron transfer method. Further, the doping density of the donor impurity in the core 28C may be uniform throughout the core 28C or may be different from region to region within the core 8C.

It is noted that the donor impurity concentration of the core 28C is preferably $1\times10^{19}$ donors/$cm^3$ or more and is further preferably $5\times10^{19}$ donors/$cm^3$ or more. It is noted that the donor impurity concentration can be measured through SIMS for instance.

The shell 28S may be made of an indirect-band-gap semiconductor material. It is noted that the shell 28S, when made of an indirect-band-gap semiconductor material, preferably has a thickness of 0.2 to 4 nm inclusive. When the shell 28S is made of an indirect-band-gap semiconductor material as described, carriers are tunneled toward the core to achieve an effect, that is, a contribution to light emission. The indirect-band-gap semiconductor material may be any material that allows carriers to tunnel toward the core.

The light-emitting layer 25 illustrated in FIG. 9 may further contain an organic compound, such as an organic ligand not shown. For instance, dodecanethiol, ethanolamine, or other things may be contained as the organic ligand. The light-emitting layer 25 may contain an organic solvent ingredient other than the organic ligand. The organic solvent ingredient may contain a hexane or an octane for instance. The light-emitting layer 25 may contain an inorganic ligand, such as S, other than the organic ligand.

It is noted that the core 28C and the shell 28S, surrounding the core 28C, may contain one or more semiconductor materials selected from the group consisting of, for instance Cd, S, Te, Se, Zn, In, N, P, As, Sb, Al, Ga, Pb, Si, Ge, Mg, and their compounds as a material that constitutes the quantum dots 28 of the light-emitting layer 25. Further, the quantum dots 28 may fall under, for instance, a binary-core type, a tertiary-core type, a quaternary-core type, a core-shell type or a core-multi-shell type.

Further, the light-emitting layer 25 may contain doped nanoparticles or may have an inclined-composition structure. Further, the composition of a constituent element may be adjusted through processing into mixed crystals in order to obtain a necessary light emission wavelength.

The light-emitting layer 25 may have any thickness that can provide a location for electron-and-hole recombination to exert the function of light emission; for instance, the light-emitting layer 25 can have a thickness of about 1 to 200 nm.

A method of forming the light-emitting layer 25, which is similar to the method of forming the light-emitting layer 5 already described in the first embodiment, will not be described herein.

FIG. 10(*a*) illustrates the band of a known light-emitting element that includes the light-emitting layer 105 composed of a quantum dot containing a core doped with no dopant.

To enhance the light emission efficiency in the known light-emitting element having the configuration illustrated in FIG. 10(*a*), the amount of hole injection into the core and the amount of electron injection into the core need to be controlled accurately. Unfortunately, it is realistically difficult to control the amount of carrier (holes and electrons) injection into the core accurately; thus, satisfactory light emission efficiency cannot be achieved.

FIG. 10(*b*) illustrates the band of the light-emitting element 21 that includes the light-emitting layer 25 including the core 28C of n-type containing a donor impurity as a dopant.

As illustrated in FIG. 10(*b*), the core 28C, which contains a donor impurity as a dopant, has electrons $e^-$ awaiting, which are herein major carriers, and injecting holes $h^+$, which are herein minor carriers, thereinto allows the light-emitting element 21 to emit light.

As such, the light-emitting element 21, which can control carrier balance (balance between holes and electrons) by only the amount of hole injection, can improve light emission efficiency further than the known light-emitting element having the configuration illustrated in FIG. 10(*a*).

Fifth Embodiment

Figure 11:
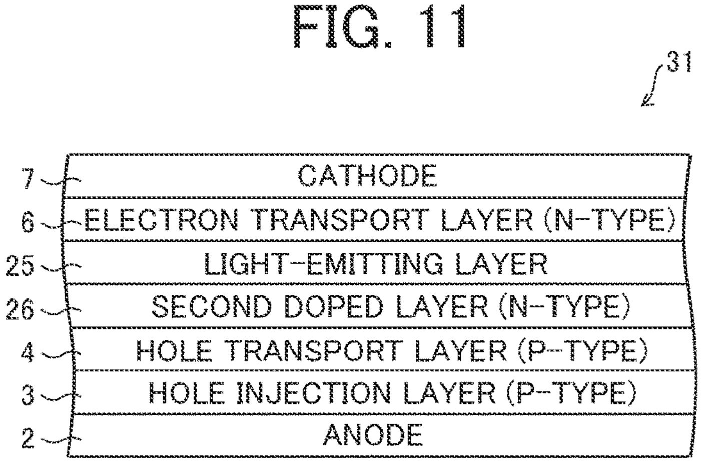
FIG. 11 is a sectional view of a schematic configuration of a light-emitting element according to a fifth embodiment.
Figure 12:
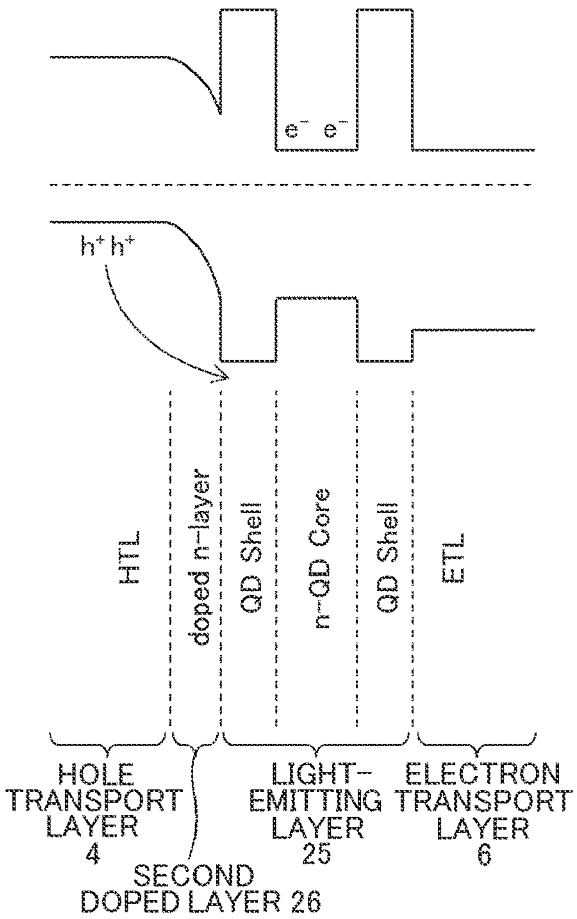
FIG. 12 illustrates the band of the light-emitting element according to the fifth embodiment.
Figure 13:
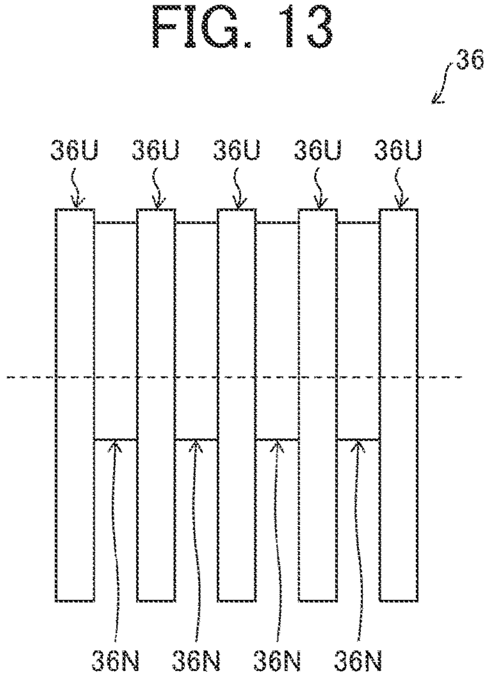
FIG. 13 illustrates a modification of a second doped layer included in the light-emitting element according to the fifth embodiment.

The following describes a fifth embodiment of the disclosure on the basis of FIG. 11 through FIG. 13. A light-emitting element 31 according to this embodiment is different from the light-emitting element 21 described in the fourth embodiment in that a second doped layer 26 containing a donor impurity is further provided between the hole transport layer 4 and the light-emitting layer 25. The others are as described in the fourth embodiment. For convenience in description, components having the same functions as the components shown in the drawings relating to the fourth embodiment will be denoted by the same signs, and their description will be omitted.

FIG. 11 is a sectional view of a schematic configuration of the light-emitting element 31 according to the fourth embodiment.

The light-emitting element 31 illustrated in FIG. 11 further includes the second doped layer 26 provided between the hole transport layer 4 and the light-emitting layer 25, and containing a donor impurity.

The donor impurity (second donor impurity) contained in the second doped layer 26 may be a donor impurity identical to or different from the donor impurity (first donor impurity) contained in the core 28C.

The second doped layer (highly doped n-type layer) 26 may be an organic layer made of an organic material containing a donor impurity, or an inorganic layer made of an inorganic material containing a donor impurity.

The second doped layer 26 can be formed of, for instance, an inorganic semiconductor material containing a donor impurity; examples of the inorganic semiconductor material include a group II-VI semiconductor material and a group III-V semiconductor material. Examples of the group II-VI semiconductor material include ZnS, ZnSe, ZnTe, CdS, CdSe, CdTe, HgTe and their mixed crystals, and examples of the group III-V semiconductor material include AlP, AlAs, AlN, AlSb, GaN, GaP, GaAs, GaSb, InP, InAs, InSb, InN and their mixed crystals.

The foregoing electron transfer method for instance can be used to obtain the second doped layer 26 of n-type. For instance, exposing the foregoing semiconductor material to biphenyl radical anion or Na, both being a donor impurity, can obtain the second doped layer 26 of n-type.

The second doped layer 26 can be formed by using such a semiconductor material containing a donor impurity and thorough a method similar to the forging method of forming the hole transport layer 4.

The donor impurity concentration of the second doped layer 26 is preferably $1\times10^{19}$ donors/$cm^3$ and more and is further preferably $5\times10^{19}$ donors/$cm^3$ or more.

Furthermore, the donor impurity concentration of the second doped layer 26 is preferably higher than the donor impurity concentration of the electron transport layer 6; in the light-emitting element 31 according to this embodiment, the donor impurity concentration of the electron transport layer 6 stands at $1\times10^{19}$ donors/$cm^3$, and the donor impurity concentration of the second doped layer 26 stands at $5\times10^{19}$ donors/$cm^3$. It is noted that the donor impurity concentration can be measured through SIMS for instance.

The thickness of the second doped layer 26 is preferably equal to or larger than the thickness of a stack of several molecules and equal to or smaller than 50 nm, and the thickness is further preferably equal to or larger than the thickness of a stack of several molecules and equal to or smaller than 20 nm.

In the light-emitting element 21 according to the fourth embodiment, which does not include the foregoing second doped layer 26, the core 28C of the quantum dot 28 within the light-emitting layer 25 is depleted to cause ionized donors (positively electrified to repel holes) to remain, as illustrated in FIG. 10(*b*). Accordingly, due to the effect of the repulsion of the ionized donors remaining in the core 28C, a relatively high voltage needs to be applied in order to inject holes $h^+$ into the core 28C.

FIG. 12 illustrates the band of the light-emitting element 31 according to the fifth embodiment.

The light-emitting element 31 according to this embodiment, which includes the foregoing second doped layer 26 between the hole transport layer 4 and the light-emitting layer 25, as illustrated in FIG. 12, can avoid the depletion of the core 28C of the quantum dot 28 within the light-emitting layer 25. Thus, applying a relatively low voltage to inject holes $h^+$, which are herein minor carriers, into the core 28C with electrons $e^-$ awaiting, which are herein major carriers, thereby enabling light emission.

FIG. 13 illustrates a modification of the second doped layer 26 included in the light-emitting element 31 according to the fifth embodiment.

A second doped layer 36 illustrated in FIG. 13 includes a plurality of n-type doped layers 36N, and between the plurality of n-type doped layers 36N is a separation layer 36U containing no dopant and having a band gap larger than the band gaps of the n-type doped layers 36N. It is noted here that each n-type doped layer 36N is the foregoing second doped layer 26.

In the second doped layer 26 included in the light-emitting element 31, n-type activation energy increases along with increase in band gap. In the second doped layer 36 having a super-lattice shape by contrast, as illustrated in FIG. 13, the n-type activation energy can be maintained as it is even when the band gap is increased substantially.

The second doped layer 36 having such a super-lattice shape can be used suitably when one wants to adjust its band gap to avoid the second doped layer from absorbing light from the light-emitting layer 25.

It is noted that at least one of the n-type doped layer 36N and separation layer 36U illustrated in FIG. 13 may contain nanoparticles. Providing nanoparticles as described can further facilitate band gap adjustment.

Sixth Embodiment

Figure 14:
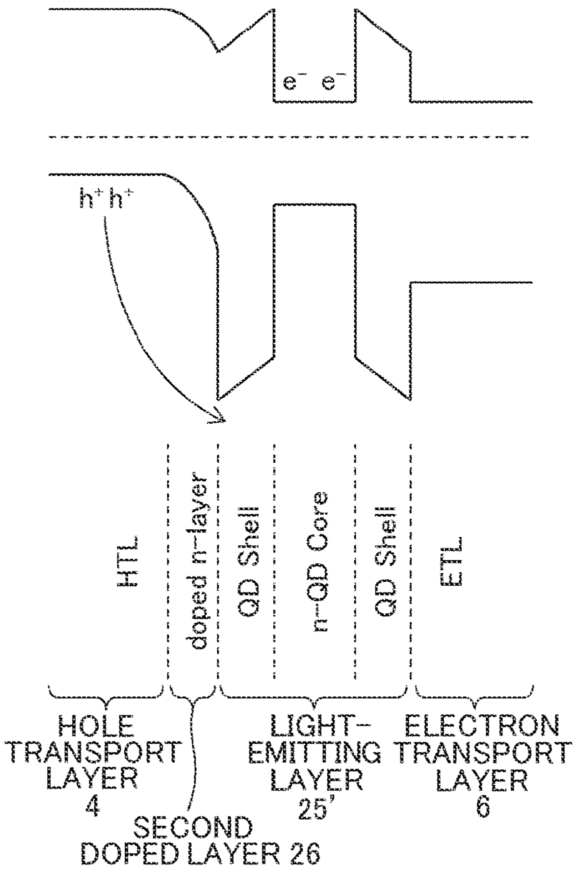
FIG. 14 illustrates the band of a light-emitting element according to a sixth embodiment.

The following describes a sixth embodiment of the disclosure on the basis of FIG. 14. A light-emitting element according to this embodiment is different from the light-emitting element 31 described in the fifth embodiment in that the quantum dot 28 of a light-emitting layer 25' included in the light-emitting element is configured such that not only the core 28C contains a donor impurity, but also the shell 28S contains a donor impurity. The others are as described in the fifth embodiment. For convenience in description, components having the same functions as the components shown in the drawings relating to the fifth embodiment will be denoted by the same signs, and their description will be omitted.

FIG. 14 illustrates the band of the light-emitting element according to the sixth embodiment.

The quantum dot 28 of the light-emitting layer 25' included in the light-emitting element according to this embodiment illustrated in FIG. 14 is configured such that not only the core 28C contains a donor impurity, but also the shell 28S contains a donor impurity (third donor impurity). In a case like this, where not only the core 28C, but also the shell 28S contains a donor impurity, a barrier against electron injection from the cathode 7 can be lowered.

It is noted that the concentration of the donor impurity contained in the shell 28S may be uniform throughout the shell 28S or may be different from region to region within the shell 28S. Furthermore, the concentration of the donor impurity contained in the shell 28S may be set so as to increase or decrease gradually in accordance with the distance from the core 28C.

The concentration of the donor impurity contained in the shell 28S is set in this embodiment so as to increase along with distance from the core 28C. The shell 28S thus contains a donor impurity that increases in number along with distance from the core 28C (outward from the core 28C), but as illustrated in the band of QD Shells in FIG. 14, the shell 28S has a band gap that does not vary throughout the shell 28S and has a valence band and a conduction band that become low along with distance from the core 28C. In such a configuration, the conduction band of the shell 28S becomes low along with approach to the outside of the shell 28S, thereby enabling a barrier against electron injection from the cathode 7 to be lowered, thus enabling the efficiency of the electron injection to be improved. In the light-emitting element according to this embodiment in particular, the conduction band of the shell 28S, which is inclined in such a manner that the barrier enlarges gradually from a direction where electrons are supplied, offers an effect, that is, substantial barrier downsizing.

The shell 28S can be doped with a donor impurity through a method similar to the foregoing method of doping the core 28C with a donor impurity described in the fourth embodiment.

It is noted that when the core 28C and the shell 28S are to be doped with the same kind of donor impurity, the quantum dot 28 including the core 28C and shell 28S may be doped with a donor impurity. That is, the core 28C and the shell 28S may be doped with a donor impurity at one time in a single process step.

When the core 28C and the shell 28S are to be doped with different kinds of donor impurity in contrast, a process step of doping the core 28C with a donor impurity and a process step of doping the shell 28S with a donor impurity need to be performed separately.

In this embodiment, the quantum dot 28 including the core 28C already doped with a donor impurity, and the shell 28S formed so as to cover the core 28C and doped with no donor impurity is doped with a donor impurity so that the shell 28S has more donor impurities along with distance from the core 28C. Doping the shell 28S with a donor impurity from outside in this way enables the shell 28S near the core 28C to have a low donor impurity concentration and enables the shell 28S far from the core 28C to have a high donor impurity concentration, but this is non-limiting. For instance, one may perform doping while changing the concentration of the donor impurity in order to grow a crystal of the shell 28C.

Furthermore, the shell 28S may be formed of, for instance, a plurality of layers having different donor impurity concentrations, and the donor impurity concentrations of the plurality of respective layers may be set high in ascending order of distance from the core 28C. For instance, when the shell 28S is formed of two layers having different donor impurity concentrations, the donor impurity concentration of a first layer disposed near the core 28C and having a lower donor impurity concentration may be set at $5\times10^{17}$ donors/$cm^3$, and the donor impurity concentration of a second layer disposed farther away from the core 28C and having a higher donor impurity concentration may be set at $1\times10^{18}$ donors/$cm^3$.

As described above, this embodiment has described a non-limiting instance where the shell 28S is doped with a donor impurity; for instance, the crystal of the shell 28S may be grown in such a manner that the concentration of at least one element that constitutes a compound contained in the shell 28S has a gradient between a first region of the shell 28S being closest to the core 28C and a second region of the shell 28S being farthest from the core 28C.

Furthermore, the shell 28S may be formed of a plurality of layers in such a manner that the concentration of at least one element that constitutes the compound contained in the shell 28S has a gradient between the first region of the shell 28S, which is closest to the core 28C, and the second region of the shell 28S, which is farthest from the core 28C.

The foregoing configuration where the concentration of at least one element that constitutes the compound contained in the shell 28S has a gradient between the first region of the shell 28S, which is closest to the core 28C, and the second region of the shell 28S, which is farthest from the core 28C, can achieve an effect similar to that achieved in an instance where the concentration of the donor impurity contained in the shell 28S is set so as to increase or decrease gradually in accordance with the foregoing distance from the core 28C.

SUMMARY

First Aspect

A light-emitting element including:
- a cathode;
- an anode; and
- a light-emitting layer disposed between the cathode and the anode, and containing a quantum dot including a core and a shell,
- wherein the core contains a dopant.

Second Aspect

The light-emitting element according to the first aspect, wherein the light-emitting layer further contains an organic compound.

Third Aspect

The light-emitting element according to the first or second aspect, wherein
- the core contains a first acceptor impurity as the dopant,
- an electron transport layer is further provided between the cathode and the light-emitting layer, and
- a first doped layer containing a second acceptor impurity is provided between the electron transport layer and the light-emitting layer.

Fourth Aspect

The light-emitting element according to the third aspect, wherein the shell contains a third acceptor impurity.

Fifth Aspect

The light-emitting element according to the third or fourth aspect, wherein the first doped layer is an inorganic layer.

Sixth Aspect

The light-emitting element according to any one of the third to fifth aspects, wherein an acceptor impurity concentration of the first doped layer is $1\times10^{19}$ acceptors/$cm^3$ or more.

Seventh Aspect

The light-emitting element according to the sixth aspect, wherein the acceptor impurity concentration of the first doped layer is $5\times10^{19}$ acceptors/$cm^3$ or more.

Eighth Aspect

The light-emitting element according to any one of the third to fifth aspects, further including a hole transport layer between the anode and the light-emitting layer, wherein an acceptor impurity concentration of the first doped layer is higher than an acceptor impurity concentration of the hole transport layer.

Ninth Aspect

The light-emitting element according to any one of the third to eighth aspects, wherein a thickness of the first doped layer is 50 nm or smaller.

Tenth Aspect

The light-emitting element according to the ninth aspect, wherein the thickness of the first doped layer is 20 nm or smaller.

Eleventh Aspect

The light-emitting element according to any one of the third to tenth aspects, wherein the first acceptor impurity is doped in a portion of the core distant from a center of the core by a half or more of a radius of the core.

Twelfth Aspect

The light-emitting element according to any one of the third to eleventh aspects, wherein the first doped layer includes a plurality of first doped layers, and a separation layer containing no dopant and having a band gap larger than a band gap of the first doped layer is provided between the plurality of first doped layers.

Thirteenth Aspect

The light-emitting element according to the twelfth aspect, wherein at least one of the first doped layer and the separation layer contains a nanoparticle.

Fourteenth Aspect

The light-emitting element according to the fourth aspect, wherein a concentration of the third acceptor impurity contained in the shell increases along with distance from the core.

Fifteenth Aspect

The light-emitting element according to the first or second aspect, wherein the core contains a first donor impurity as the dopant, a hole transport layer is further provided between the anode and the light-emitting layer, and a second doped layer containing a second donor impurity is provided between the hole transport layer and the light-emitting layer.

Sixteenth Aspect

The light-emitting element according to the fifteenth aspect, wherein the shell contains a third donor impurity.

Seventeenth Aspect

The light-emitting element according to the fifteenth or sixteenth aspect, wherein the second doped layer is an inorganic layer.

Eighteenth Aspect

The light-emitting element according to any one of the fifteenth to seventeenth aspects, wherein a donor impurity concentration of the second doped layer is $1\times10^{19}$ donors/cm$^3$ or more.

Nineteenth Aspect

The light-emitting element according to the eighteenth aspects, wherein the donor impurity concentration of the second doped layer is $5\times10^{19}$ donors/cm$^3$ or more.

Twentieth Aspect

The light-emitting element according to any one of the fifteenth to seventeenth aspects, further including an electron transport layer between the cathode and the light-emitting layer, wherein a donor impurity concentration of the second doped layer is higher than a donor impurity concentration of the electron transport layer.

Twenty-First Aspect

The light-emitting element according to any one of the fifteenth to twentieth aspects, wherein a thickness of the second doped layer is 50 nm or smaller.

Twenty-Second Aspect

The light-emitting element according to the twenty-first aspect, wherein the thickness of the second doped layer is 20 nm or smaller.

Twenty-Third Aspect

The light-emitting element according to any one of the fifteenth to twenty-second aspects, wherein the first donor impurity is doped in a portion of the core distant from a center of the core by a half or more of a radius of the core.

Twenty-Fourth Aspect

The light-emitting element according to any one of the fifteenth to twenty-third aspects, wherein the second doped layer includes a plurality of second doped layers, and a separation layer containing no dopant and having a band gap larger than a band gap of the second doped layer is provided between the plurality of second doped layers.

Twenty-Fifth Aspect

The light-emitting element according to the twenty-fourth aspect, wherein at least one of the second doped layer and the separation layer contains a nanoparticle.

Twenty-Sixth Aspect

The light-emitting element according to the sixteenth aspect, wherein a concentration of the third donor impurity contained in the shell increases along with distance from the core.

Twenty-Seventh Aspect

The light-emitting element according to any one of the first to twenty-sixth aspects, wherein a concentration of at least one element constituting a compound contained in the shell has a gradient between a first region of the shell being closest to the core and a second region of the shell being farthest from the core.

Twenty-Eighth Aspect

The light-emitting element according to any one of the first to twenty-seventh aspects, wherein the shell is made of an indirect-band-gap semiconductor material.

Additional Note

The disclosure is not limited to the foregoing embodiments. Various modifications can be devised within the scope of the claims. An embodiment that is obtained in combination, as appropriate, with the technical means disclosed in the respective embodiments is also included in the technical scope of the disclosure. Furthermore, combining the technical means disclosed in the respective embodiments can form a new technical feature.

Industrial Applicability

The disclosure can be used in a light-emitting element as well as a display device and an illumination device that include a light-emitting element.

The invention claimed is:

1. A light-emitting element comprising:

a cathode;

an anode; and a light-emitting layer disposed between the cathode and the anode, and containing a quantum dot that includes a core and a shell, wherein:

the core contains a first donor impurity as a dopant, a hole transport layer is provided between the anode and the light-emitting layer, a plurality of second doped layers containing a second donor impurity is provided between the hole transport layer and the light-emitting layer, and a separation layer containing no dopant and having a band gap larger than a band gap of each of the plurality of second doped layers is provided between the plurality of second doped layers.

2. The light-emitting element according to claim 1, wherein each of the plurality of second doped layers is an inorganic layer.

3. The light-emitting element according to claim 1, wherein a donor impurity concentration of each of the plurality of second doped layers is $1\times10^{19}$ donors/$cm^3$ or more.

4. The light-emitting element according to claim 3, wherein the donor impurity concentration of each of the plurality of second doped layers is $5\times10^{19}$ donors/$cm^3$ or more.

5. The light-emitting element according to claim 1, further comprising an electron transport layer provided between the cathode and the light-emitting layer, wherein a donor impurity concentration of each of the plurality of second doped layers is higher than a donor impurity concentration of the electron transport layer.

6. The light-emitting element according to claim 1, wherein a thickness of each of the plurality of second doped layers is 50 nm or smaller.

7. The light-emitting element according to claim 1, wherein the first donor impurity is doped in a portion of the core distant from a center of the core by a half or more of a radius of the core.

8. The light-emitting element according to claim 1, wherein the shell is made of an indirect-band-gap semiconductor material.

9. A light-emitting element comprising:

a cathode;

an anode; and a light-emitting layer disposed between the cathode and the anode, and containing a quantum dot that includes a core and a shell, wherein:

the core contains a first donor impurity as a dopant, a hole transport layer is provided between the anode and the light-emitting layer, a plurality of second doped layers containing a second donor impurity is provided between the hole transport layer and the light-emitting layer, a concentration of at least one element forming a compound that is contained in the shell has a gradient between a first region of the shell being closest to the core and a second region of the shell being farthest from the core, and a separation layer containing no dopant and having a band gap larger than a band gap of each of the plurality of second doped layers is provided between the plurality of second doped layers.

* * * * *